United States Patent
Daamen et al.

(10) Patent No.: US 9,862,600 B2
(45) Date of Patent: Jan. 9, 2018

(54) CHIP STRUCTURE

(71) Applicant: ams International AG, Rapperswil (CH)

(72) Inventors: Roel Daamen, Eindhoven (NL); Hendrik Bouman, Nijmegen (NL); Kailash Vijayakumar, Chennai (IN)

(73) Assignee: AMS INTERNATIONAL AG, Rapperswil-Jona (CH)

( * ) Notice: Subject to any disclaimer, the term of this patent is extended or adjusted under 35 U.S.C. 154(b) by 0 days.

(21) Appl. No.: 14/718,152

(22) Filed: May 21, 2015

(65) Prior Publication Data

US 2016/0340180 A1 Nov. 24, 2016

(51) Int. Cl.
*B81C 1/00* (2006.01)
*H01L 23/64* (2006.01)
*B81B 7/00* (2006.01)

(52) U.S. Cl.
CPC ........ *B81C 1/00825* (2013.01); *B81B 7/0016* (2013.01); *H01L 23/642* (2013.01); *B81B 2201/0264* (2013.01); *B81B 2203/0127* (2013.01); *B81B 2207/015* (2013.01); *B81B 2207/03* (2013.01); *B81C 2201/0104* (2013.01);

(Continued)

(58) Field of Classification Search
CPC ............ H01L 25/0657; H01L 2224/97; H01L 51/5253; H01L 24/95; H01L 23/642; B81B 2201/0264; B81B 2203/0127; B81B 2207/015; B81B 2207/03; B81B 7/0016; B81B 7/0019; B81B 7/0022; B81B 7/0025; B81C 1/00825; B81C 2201/0104; B81C 2201/0146; B81C 2203/0735

See application file for complete search history.

(56) References Cited

U.S. PATENT DOCUMENTS 6,448,109 B1 * 9/2002 Karpman .............. B81B 7/0077
156/182
8,794,075 B2 * 8/2014 Besling ................. G01L 9/0045
73/715

(Continued)

FOREIGN PATENT DOCUMENTS

WO WO-0185600 A1 11/2001
WO WO-02059679 A1 8/2002

(Continued)

OTHER PUBLICATIONS

Bosch; BMP280 Digital Pressure Sensor Data Sheet; retrieved from the internet https://www.bosch-sensortec.com/en/homepage/products_3/environmental_sensors_1/bmp280/bmp280; 48 pages (Nov. 2014).

(Continued)

*Primary Examiner* — Marcos D Pizarro
*Assistant Examiner* — Shannon Yi
(74) *Attorney, Agent, or Firm* — McDermott Will & Emery LLP (57) ABSTRACT

One example discloses an chip, comprising: a substrate; a first side of a passivation layer coupled to the substrate; a device, having a device height and a cavity, wherein a first device surface is coupled to a second side of the passivation layer which is opposite to the first side of the passivation layer; and a set of structures coupled to the second side of the passivation layer and configured to have a structure height greater than or equal to the device height.

15 Claims, 9 Drawing Sheets (52) U.S. Cl.
CPC ............... *B81C 2201/0146* (2013.01); *B81C 2203/0735* (2013.01)

(56) References Cited

U.S. PATENT DOCUMENTS

| | | | |
|---|---|---|---|
| 9,331,137 B1* | 5/2016 | Ratakonda | H01L 28/60 |
| 2005/0104176 A1* | 5/2005 | Rodney | E21B 47/0002 |
| | | | 257/678 |
| 2006/0049525 A1 | 3/2006 | Lin et al. | |
| 2008/0191293 A1* | 8/2008 | Liu | B81C 1/00253 |
| | | | 257/415 |
| 2011/0026742 A1* | 2/2011 | Huang | B81C 1/00246 |
| | | | 381/174 |
| 2011/0233782 A1* | 9/2011 | Chang | H01L 23/481 |
| | | | 257/753 |
| 2011/0278722 A1 | 11/2011 | Miki | |
| 2013/0118265 A1 | 5/2013 | Besling et al. | |
| 2013/0119435 A1 | 5/2013 | Dungan | |
| 2013/0236988 A1* | 9/2013 | Sridharamurthy | H01L 29/66007 |
| | | | 438/3 |
| 2014/0167270 A1* | 6/2014 | Ganitzer | H01L 21/02697 |
| | | | 257/763 |
| 2014/0175572 A1* | 6/2014 | Hsu | B81B 3/0086 |
| | | | 257/415 |
| 2014/0239353 A1 | 8/2014 | Daneman et al. | |
| 2014/0264653 A1* | 9/2014 | Cheng | B81C 1/00238 |
| | | | 257/416 |
| 2014/0338459 A1 | 11/2014 | Besling et al. | |
| 2015/0087207 A1* | 3/2015 | Sekiya | H01L 21/6836 |
| | | | 451/54 |
| 2015/0315016 A1* | 11/2015 | Yoneoka | B81C 1/00269 |
| | | | 438/51 |
| 2016/0145094 A1* | 5/2016 | Lee | B81B 7/007 |
| | | | 257/774 |
| 2016/0266061 A1* | 9/2016 | Yu | G01N 27/223 |

FOREIGN PATENT DOCUMENTS

| | | |
|---|---|---|
| WO | 2010/092399 A2 | 8/2010 |
| WO | WO-2014209358 A1 | 12/2014 |

OTHER PUBLICATIONS

Besling, Willem et al; "U.S. Appl. No. 14/444,921—Suspended Membrane for Capacitive Pressure Sensor"; filed Jul. 28, 2014.

Zaal, J.J.M. et al; "Reliability of Wafer Thin Film MEMS Packages during Wafer Backgrinding"; IEEE 2009 Int'l Conf. on Electronic Packaging Technology & High Density Packaging, Beijing; pp. 679-683 (Aug. 2009).

* cited by examiner

CHIP STRUCTURE

The present specification relates to systems, methods, apparatuses, devices, articles of manufacture and instructions for chip structures.

Pressure sensors and other devices with cavities and membranes can be susceptible to damage during later wafer and chip processing steps.

Pressure sensors fabricated within a silicon substrate tend to be the best protected and thus are less susceptible to damage during later back-end processing. Such back-end processing can include back-grinding for substrate thinning.

Pressure sensors fabricated as standalone modules on separate substrates, which are then capped with a silicon, are also less susceptible to damage if they are not further processed.

SUMMARY

An example embodiment includes a chip, comprising: a substrate; a first side of a passivation layer coupled to the substrate; a device, having a device height and a cavity, wherein a first device surface is coupled to a second side of the passivation layer which is opposite to the first side of the passivation layer; and a set of structures coupled to the chip and configured to have a structure height greater than or equal to the device height.

In another example embodiment, the set of structures are coupled to the substrate.

In another example embodiment, the set of structures coupled to the second side of the passivation layer.

In another example embodiment, the structures are of a same type and are on at least four sides of the device.

In another example embodiment, the structure types include at least one of: a rigid structure, a closed device, a spacer structure, a support structure, a reference capacitor, a decoupling capacitor, a polyimide, or a structure that does not contain a cavity.

In another example embodiment, the structures completely surround the device.

In another example embodiment, the set of structures are only configured to have a structure height greater than or equal to the device height.

In another example embodiment, the set of structures include a surface configured to receive an adhesive tape.

Another example embodiment, further comprising the adhesive tape; and the tape is coupled only to the structures.

In another example embodiment, the device is at least one of: a membrane, a transducer, a MEMS device, or a pressure sensor.

Another example embodiment, further comprising a seal layer on top of the device.

In another example embodiment, the substrate includes an integrated circuit on the first side of the passivation layer.

In another example embodiment, the integrated circuit is an analog circuit and the structures are decoupling capacitors.

In another example embodiment, the integrated circuit does not include the structures.

Another example embodiment, includes a method fabricating an chip: wherein the chip includes, a substrate; a first side of a passivation layer coupled to the substrate; a device, having a device height and a cavity, wherein a first device surface is coupled to a second side of the passivation layer which is opposite to the first side of the passivation layer; and a set of structures coupled to the second side of the passivation layer and configured to have a structure height greater than or equal to the device height; and the method comprising, applying tape to a first side of the chip, grinding a second side of the chip opposite to the first side; and wherein the structures are configured to spread a pressure exerted during the grinding process so as to avoid damaging the device.

Another example embodiment, further comprises removing the tape from the chip; and the structures are configured to prevent removal of the tape from damaging the device.

The above discussion is not intended to represent every example embodiment or every implementation within the scope of the current or future Claim sets. The Figures and Detailed Description that follow also exemplify various example embodiments.

Various example embodiments may be more completely understood in consideration of the following Detailed Description in connection with the accompanying Drawings, in which:

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

DETAILED DESCRIPTION

Pressure sensors transducers placed on or near the surface of a silicon substrate, or on top of CMOS, BiCMOS, Bipolar, High Voltage and integrated circuits, however, are much more susceptible to damage during later back-end processing steps.

Such pressure sensor transducers not only stick out from top surface (e.g. by about 3 μm) of the substrate, but also are slightly deflected under pressure thus exposing their edges to even more concentrated mechanical pressure and stress during wafer back-end processes, such as grinding, so that after back-end processing de-taping can substantially damage, break, crack or detach the pressure sensor membranes or other parts.

For example, in some example embodiments there is a single transducer per die. Thus on a full wafer, pressure sensors may only take up 10-20% of the die surface area, and pressure from later taping/grinding/de-taping is concentrated on these pressure sensors, thereby causing damage.

Adding structures to the other 80-90% of the wafer surface at the Front-End, would spread the pressure exerted during the grinding/thinning process amongst the structures and the transducers and thereby reduce broken, damaged or detached membranes during the Back-End process.

These additional structures can also be electronically or mechanically functional (e.g. serve as reference capacitors).

Embodiments of such a ruggedized pressure sensor design are compatible with main stream assembly technology.

Figure 1A:
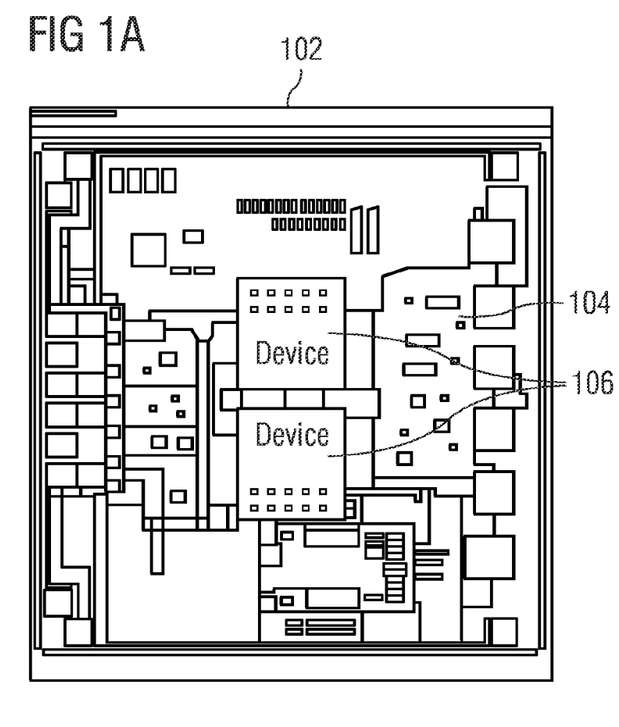
FIG. 1A is an example wafer portion.

FIG. 1A is an example wafer portion 102. The wafer portion 102 includes a substrate, an integrated circuit 104, and two devices 106. In other example embodiments there may only be one device 106. The devices in one example embodiment are structures with cavities, as is discussed below. Since the devices 106 are on top of a passivation layer on the wafer 102, the devices 106 are at a greater height than the surrounding passivation layer. As such, the devices 106 are more susceptible to significant pressure gradients and thus damage during processing of the wafer 102, such as during back-end grinding.

Figure 1B:
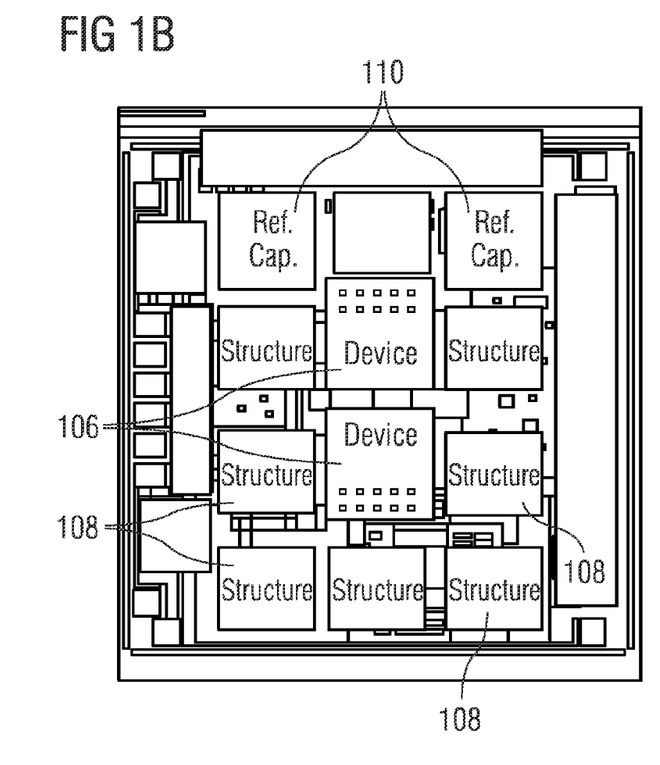
FIG. 1B is a first example set of chip structures.

FIG. 1B is a first example set of chip (e.g. die) structures 108 and 110 positioned about the devices 106. The structures 108 and 110 are of a height such that pressure gradients and/or damage to the devices 106 is lessened or eliminated during processing of the wafer 102, since the devices 106 tend to be sticking out on top of the chip.

While in one embodiment, the devices 106 may be a pressure sensor, a transducer, a membrane, or a MEMS device, in alternate embodiments, the devices may be any structure that needs to be protected, or is susceptible to breakage, during processing of the wafer 102.

The structures 108 and 110 distribute the substantial grinding pressure during thinning of the wafer 102 on the back-side. The structures 108 and 110 provide additional contact points (i.e. supports) for adhesive tape and wafer fabrication tools used during the back-grinding process.

The structures 108 and 110 may be formed as various structural types including: a rigid structure, a closed device, a spacer structure, a support structure, a reference capacitor 110, a decoupling capacitor, a polyimide, or a structure that does not contain a cavity.

Figure 2:
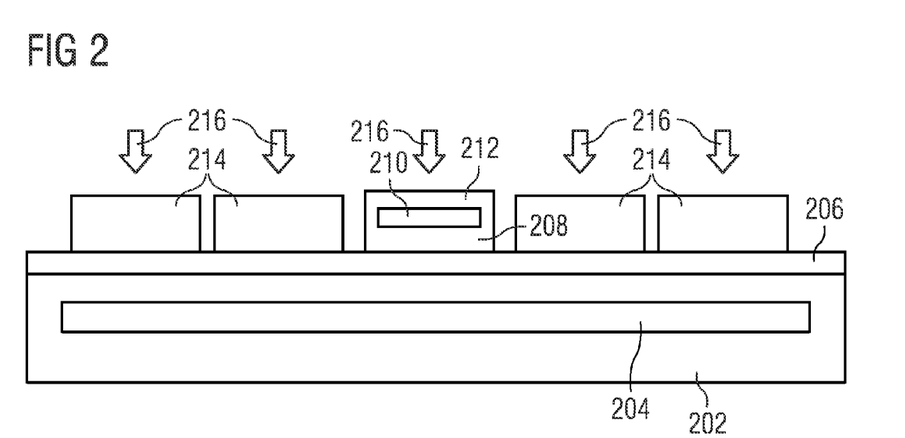
FIG. 2 is a second example set of chip structures.

FIG. 2 is a second example set of chip structures. FIG. 2 shows a substrate 202 (e.g. Silicon) including an integrated circuit 204. On top of the substrate 202 is a passivation layer 206. On top of the passivation layer 206 is a device 208 having a cavity 210 and a membrane 212. In devices 208 which are sealed, such as pressure sensor transducers, the membrane 212 deflects due to pressure of the ambient surroundings. Such membrane 212 deflection exposes edges of the membrane 212 to greater grinding pressures, which push the edges further into the adhesive tape used during grinding, such that when the tape is removed the membrane can be damaged or even ripped off entirely.

Surrounding the device 208 is a set of structures 214. As introduced above the structures 214 completely or somewhat protect the device 208 from back-grinding pressure 216 and can have a height such that the adhesive tape does not contact the edges of the membrane 212. In some example embodiments, the device 208 and structures 214 may be covered with a sealing layer. In one example embodiment, either or both the device 208 and structures 214 are electrically connected to the integrated circuit 204, perhaps using tungsten plugs and/or slits. Such an electrical connection to the structures 214 would be more likely if the structures 214 were reference capacitors or some other electrical devices.

While the device 208 is fabricated on top of the passivation layer 206, the structures 214 may be fabricated either on top of or underneath of the passivation layer 206. In one example embodiment, the set of structures are all configured to have a structure height greater than or equal to the device's height. In alternate embodiments, some of the structures may have a height less than the device's height, depending upon tooling used during back-end wafer processing.

The set of structures include a surface configured to receive an adhesive tape which may or may not contact the device 208. Thus in some embodiments, the tape is coupled only to the structures.

In some example embodiments, the integrated circuit 204 is an analog circuit and the structures are decoupling capacitors which form part of the integrated circuit 204, while in other example embodiments, the structures are not part of the integrated circuit 204.

Dual use of the structures 214 as decoupling capacitors for analog circuit ASIC optimization, can help reduce noise in such analog circuits while simultaneously protecting the device 208. Such analog designs need decoupling capacitance to reduce noise and overcome transients on the supply due to fast switching of digital, causing possible power down of the chip. In IC manufacturing, decoupling capacitors are made below the passivation layer 206 in the substrate 202. However, such capacitors also use up extra Silicon area and in the case of MIM caps even require extra masks. By moving such decoupling capacitors structures above the passivation layer 206, additional substrate 202 space for analog circuit structures is freed-up.

Figure 3A:
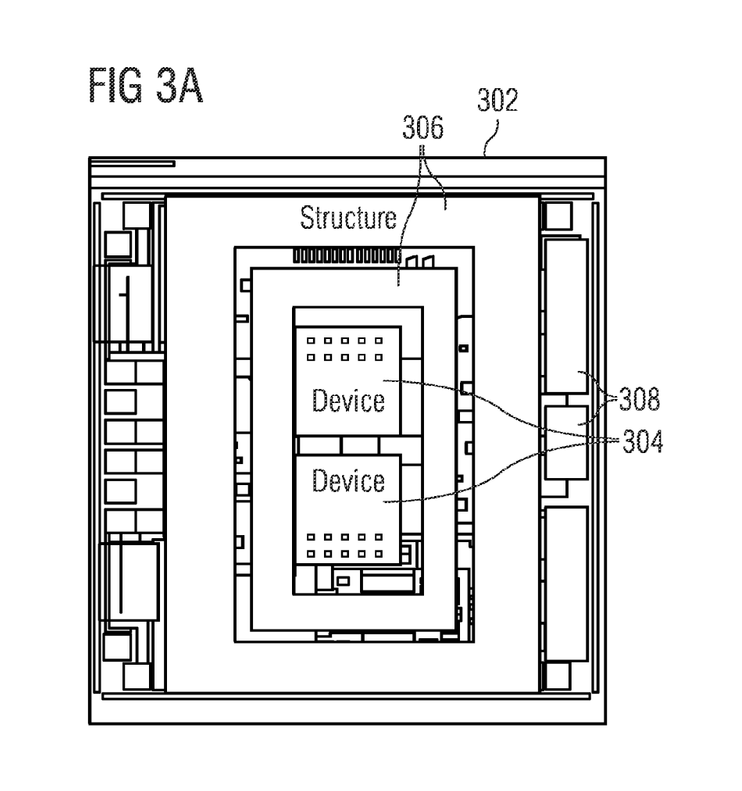
FIGS. 3A and 3B are third and fourth example sets of chip structures.
Figure 3B:
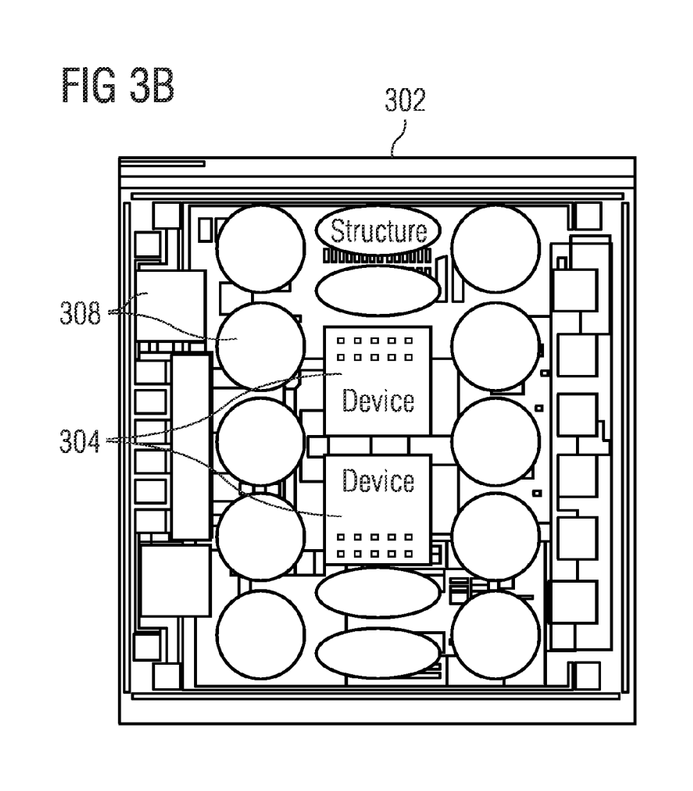

FIGS. 3A and 3B are third and fourth example sets of chip structures. FIG. 3A shows a wafer portion 302 having devices 304 and both surrounding structures 306 and standalone structures 308. FIG. 3B shows the wafer portion 302 where the stand-alone structures 308 can be a variety of shapes (e.g. square, circular, rectangular, oval, etc.). Design selection between the surrounding structures 306 and the stand-alone structures 308 depends upon the fragility of the devices 304 and other fabrication concerns. In alternate embodiments, the surrounding structures 306 can also be a variety of shapes (e.g. square, circular, rectangular, oval, etc.).

In some example embodiments, the structures are of a same type and are on at least four sides of the device, while in other example embodiments the structures may be of different types and positioned only on certain sides of the device 304.

Figure 4A:
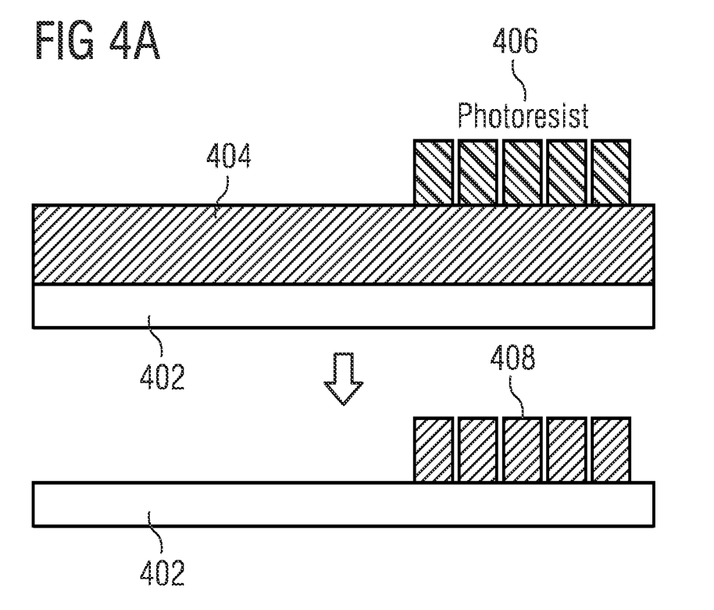
FIG. 4A is an example set of top electrode process steps for fabricating a pressure sensor without an additional structure.
Figure 4B:
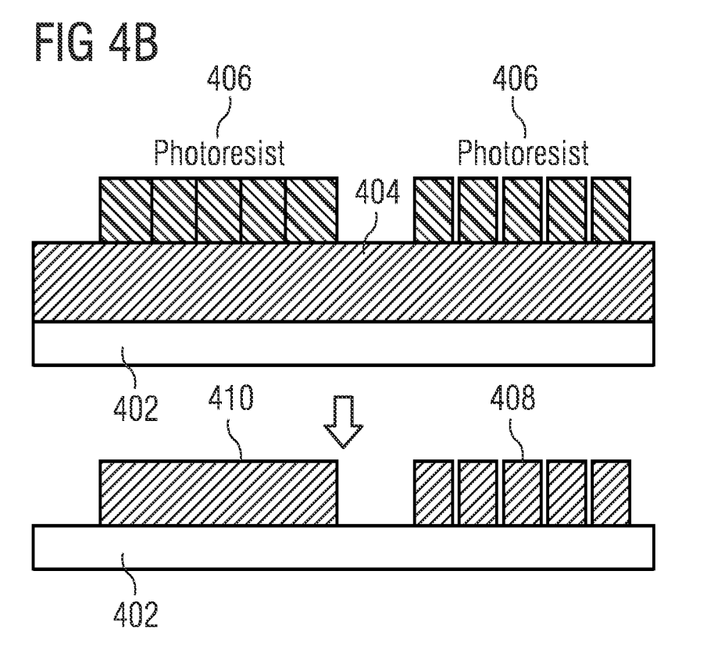
FIG. 4B is an example set of top electrode process steps for fabricating a pressure sensor with an additional structure.

FIG. 4A is an example set of top electrode process steps for fabricating a pressure sensor without an additional structure 410. FIG. 4B is an example set of top electrode process steps for fabricating a pressure sensor with the additional structure 410. Inclusion of the additional structure 410 has a number of benefits that go beyond just reducing pressure on a fragile device.

In FIGS. 4A and 4B part of a wafer portion is shown, including a sacrificial layer 402 having a metallization layer 404 on top. Photoresist 406 masks the metallization layer 404, thereby forming just a top electrode 408 in FIG. 4A or both the top electrode 408 and the additional structure 410 in FIG. 4B.

This example embodiment is beneficial for at least the following reasons. Currently 80-90% of the top electrode metal in the field needs to be removed during etch, while simultaneously very narrow release holes are etched (very high ISO/dense differences) in the 10% of the resist which defines the membranes. With the addition of reference capacitors as structures, the top electrode metal dry etching time is reduced since a much lower percentage of the metal is removed over the surface of the wafer. This results in better dry etching uniformity across the wafer.

Also due to higher amount of reference capacitors, a better idea of uniformity over the wafer (process control end hence better performance control) is obtained. Potentially better stress control over the wafer results in less performance variation, since the majority of the deposited metal now stays on the wafer. The stress will be more closely resembling the blanket layer stress, leading to better prediction of final performance.

Figure 5A:
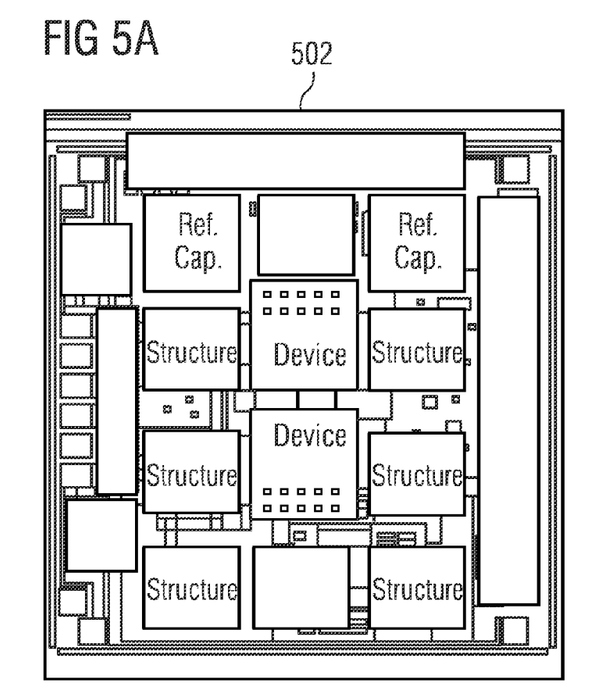
FIG. 5A is the first example set of chip structures.
Figure 5B:
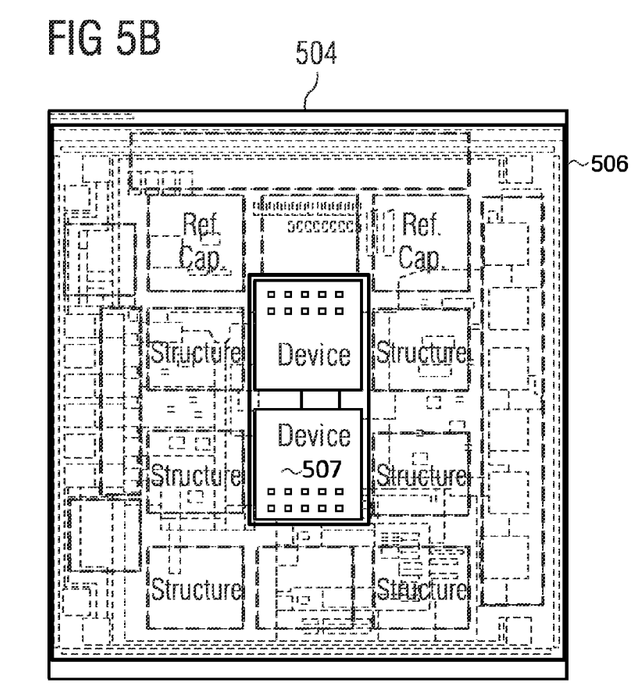
FIG. 5B is a fifth example chip structure.

FIG. 5A shows 502 the first example set of chip structures previously shown in FIG. 1B. FIG. 5B is a fifth example set of chip structures 504 including both a set of structures and an additional structure. In FIG. 5B the additional structure can be a polyimide layer. This embodiment is further described in FIG. 6.

Figure 6:
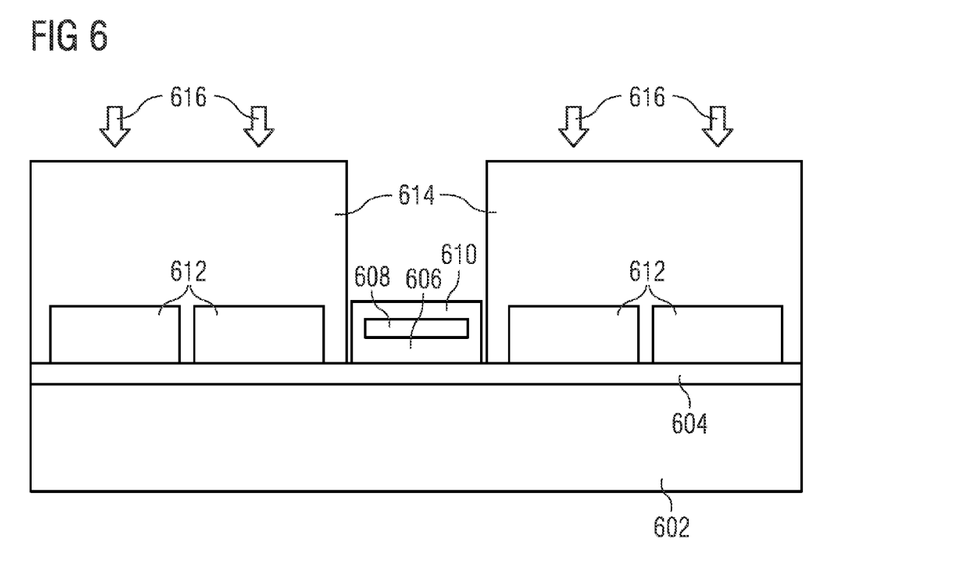
FIG. 6 is a cross-section of the fifth example set of chip structures.

FIG. 6 shows a cross-section of the fifth example set of chip structures 504. The fifth example 504 includes a substrate 602. On top of the substrate 602 is a passivation layer 604. On top of the passivation layer 604 is a device 606 having a cavity 608 and a membrane 610. Surrounding the device 606 is a set of structures 612. On top of the structures 612 are additional structures 614.

The additional structures 614 further increase a stand-off height between the device 606 and applied mechanical stress from back-grinding pressure 616. These additional structures 614, which can be made from polyimide, PBO, or any other material which reduces die-package stress and/or interaction during package assembly. The additional structures 614 function as a further stress reduction layer, which in some examples can be on the order of 5 µm in height. In this fifth example 504 there will be virtually no back-grinding pressure 616 exerted on the device 606.

Figures 7A, 7B:
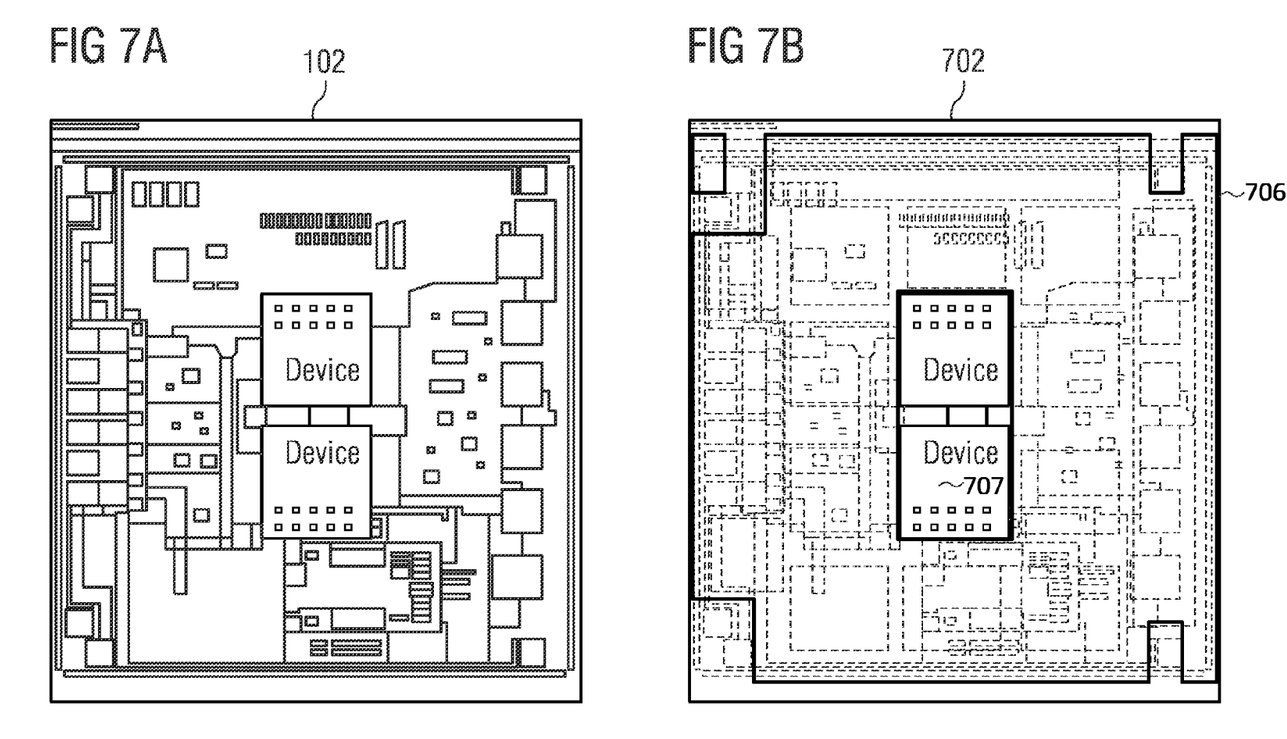
FIG. 7A is the example wafer portion.
FIG. 7B is a sixth example chip structure.

FIG. 7A shows the example wafer portion 102 previously shown in FIG. 1A. FIG. 7B is a sixth example chip structure 702. This embodiment is further described in FIG. 8.

Figure 8:
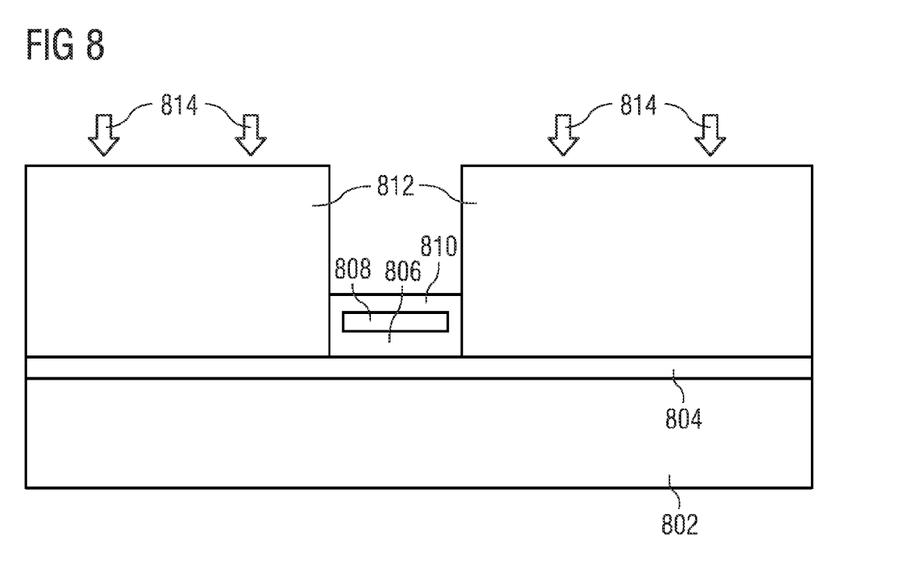
FIG. 8 is a cross-section of the sixth example set of chip structures.

FIG. 8 is a cross-section of the sixth example set of chip structures 702. The sixth example 702 includes a substrate 802. On top of the substrate 802 is a passivation layer 804. On top of the passivation layer 804 is a device 806 having a cavity 808 and a membrane 810. Surrounding the device 806 is a set of structures 812.

In this sixth example 702, only a structure 812 such as polyimide is used as a stress relief layer by creating more stand-off height.

Figure 9:
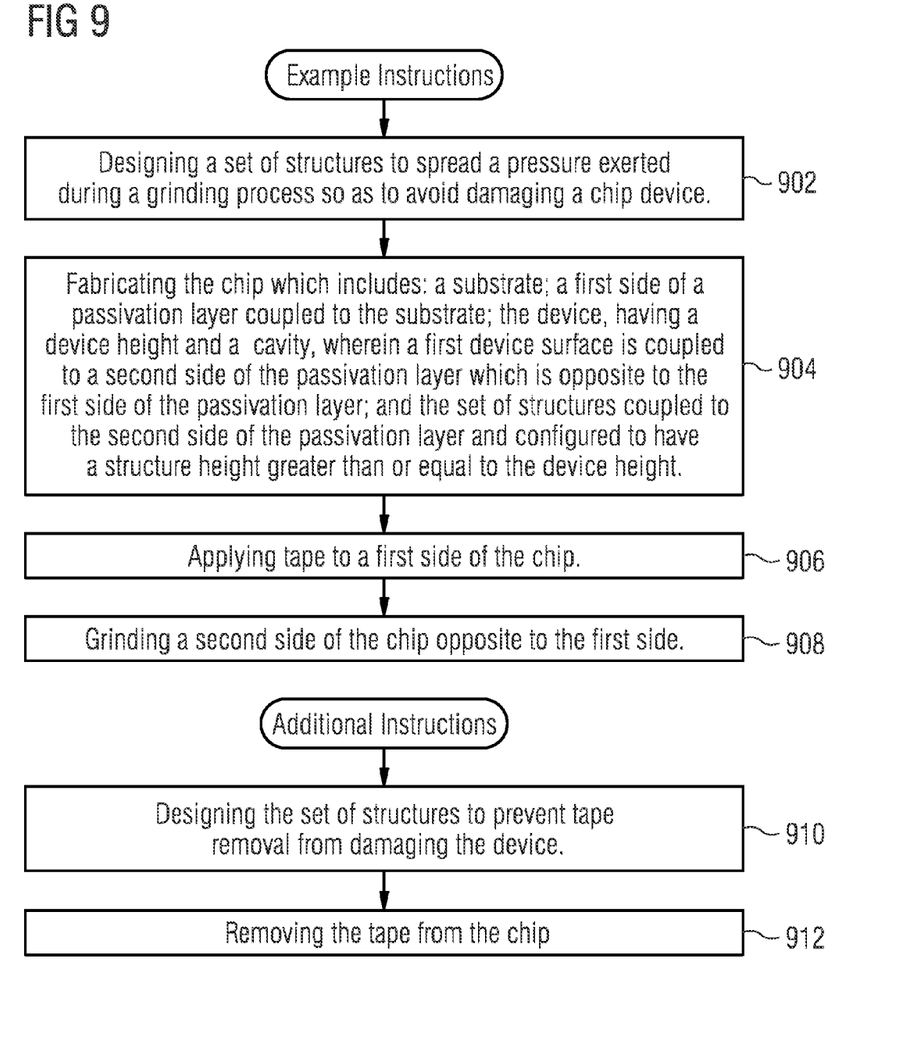
FIG. 9 is an example method of manufacturing chip structures.

FIG. 9 is an example method of manufacturing chip structures. The order in which the method elements are discussed does not limit the order in which other example embodiments implement these elements.

A first example method element begins in 902, designing a set of structures to spread a pressure exerted during a grinding process so as to avoid damaging a chip device.

Then in 904, fabricating the chip which includes: a substrate; a first side of a passivation layer coupled to the substrate; the device, having a device height and a cavity, wherein a first device surface is coupled to a second side of the passivation layer which is opposite to the first side of the passivation layer; and the set of structures coupled to the second side of the passivation layer and configured to have a structure height greater than or equal to the device height.

In 906, applying tape to a first side of the chip. Next in 908, grinding a second side of the chip opposite to the first side.

The method elements can be augmented with one or more of the following additional elements presented in no particular order.

The additional method elements include: 910—designing the set of structures to prevent tape removal from damaging the device; and 912—removing the tape from the chip.

The method elements in the above Figures can be executed in any order, unless a specific order is explicitly stated. Also, those skilled in the art will recognize that while one example method has been discussed, the material in this specification can be combined in a variety of ways to yield other examples as well, and are to be understood within a context provided by this detailed description.

In this specification, example embodiments have been presented in terms of a selected set of details. However, a person of ordinary skill in the art would understand that many other example embodiments may be practiced which include a different selected set of these details. It is intended that the following claims cover all possible example embodiments.

What is claimed is:

1. A chip, comprising:
   a substrate;
   a first side of a passivation layer coupled to the substrate;
   a device placed on and connected to the substrate, the device having a device height and a cavity, wherein a first device surface is coupled to a second side of the passivation layer which is opposite to the first side of the passivation layer; and
   a set of structures coupled to the chip,
   wherein the set of structures is separate from and independent of the device,
   wherein the set of structures is configured to have a structure height greater than or equal to the device height and configured to reduce at least one of pressure gradients or damage to the device during processing of the chip,
   wherein the substrate includes an integrated circuit on the first side of the passivation layer, and
   wherein the integrated circuit is an analog circuit and the structures are decoupling capacitors.

2. The chip of claim 1, wherein the set of structures is coupled to the substrate.

3. The chip of claim 1, wherein the set of structures is coupled to the second side of the passivation layer.

4. The chip of claim 1, wherein the structures are of a same type and are on at least four sides of the device.

5. The chip of claim 1, wherein the structures completely surround the device.

6. The chip of claim 1, wherein the set of structures is configured to have a structure height greater than or equal to the device height.

7. The chip of claim 1, wherein the set of structures include a surface configured to receive an adhesive tape.

8. The chip of claim 1, wherein the device is at least one of: a membrane, a transducer, a MEMS device, or a pressure sensor.

9. The chip of claim 1, further comprising a seal layer on top of the device.

10. The chip of claim 1, wherein the integrated circuit does not include the structures.

11. The chip of claim 4, wherein the structure types include at least one of: a rigid structure, a closed device, a spacer structure, a support structure, a reference capacitor, a decoupling capacitor, a polyimide, or a structure that does not contain a cavity.

12. The chip of claim 7, further comprising the adhesive tape, wherein the tape is coupled only to the structures.

13. A method fabricating a chip, wherein the chip comprises:
   a substrate;
   a first side of a passivation layer coupled to the substrate;
   a device placed on and connected to the substrate, the device having a device height and a cavity, wherein a first device surface is coupled to a second side of the passivation layer which is opposite to the first side of the passivation layer; and
   a set of structures coupled to the second side of the passivation layer, wherein the set of structures is separate from and independent of the device, and wherein the set of structures is configured to have a structure height greater than or equal to the device height,
   the method comprising:
      applying tape to a first side of the chip; and
      grinding a second side of the chip opposite to the first side,
   wherein the structures are configured to spread a pressure exerted during the grinding process, so as to reduce at least one of pressure gradients or damage to the device during the grinding process,
   wherein the substrate includes an integrated circuit on the first side of the passivation layer, and
   wherein the integrated circuit is an analog circuit and the structures are decoupling capacitors.

14. The method of claim 13, further comprising removing the tape from the chip, wherein the structures are configured to prevent removal of the tape from damaging the device.

15. A chip, comprising:
   a substrate;
   a first side of a passivation layer coupled to the substrate;
   a pressure sensor placed on and connected to the substrate, the pressure sensor having a pressure sensor height and a cavity, wherein a first pressure sensor surface is coupled to a second side of the passivation layer which is opposite to the first side of the passivation layer; and
   a set of structures coupled to the chip,
   wherein the set of structures is separate from and independent of the pressure sensor,
   wherein the set of structures is configured to have a structure height greater than or equal to the pressure sensor height and configured to reduce at least one of pressure gradients or damage to the pressure sensor during processing of the chip,
   wherein the substrate includes an integrated circuit on the first side of the passivation layer, and
   wherein the integrated circuit is an analog circuit and the structures are decoupling capacitors.

* * * * *